US009377515B2

(12) United States Patent
Kim et al.

(10) Patent No.: US 9,377,515 B2
(45) Date of Patent: Jun. 28, 2016

(54) FLUX-LOCKED LOOP CIRCUIT, FLUX-LOCKED LOOP METHOD, AND SQUID MEASURING APPARATUS

(75) Inventors: Jin Mok Kim, Daejeon (KR); Young Ho Lee, Daejeon (KR); Hyukchan Kwon, Daejeon (KR); Ki Woong Kim, Daejeon (KR); Kwon Kyu Yu, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 983 days.

(21) Appl. No.: 13/457,130

(22) Filed: Apr. 26, 2012

(65) Prior Publication Data

US 2012/0206136 A1    Aug. 16, 2012

Related U.S. Application Data

(63) Continuation of application No. PCT/KR2010/003305, filed on May 26, 2010.

(30) Foreign Application Priority Data

Nov. 26, 2009    (KR) .................. 10-2009-0114902

(51) Int. Cl.
*G01R 33/02* (2006.01)
*G01R 33/035* (2006.01)

(52) U.S. Cl.
CPC .......... *G01R 33/0354* (2013.01); *G01R 33/035* (2013.01)

(58) Field of Classification Search
CPC ............... G01R 33/02; G01R 33/0206; G01R 33/0213; G01R 33/04; G01R 33/045; G01R 33/05; G01R 33/06; G01R 33/07; G01R 33/072; G01R 33/075; G01R 33/077; G01R 33/09; G01R 33/091; G01R 33/093; G01R 33/095; G01R 33/096; G01R 33/098; G01R 33/028; G01R 33/0283; G01R 33/0286; G01R 33/035; G01R 33/0354; G01R 33/0356; G01R 33/0358; Y10S 505/702; Y10S 505/842; Y10S 505/843; Y10S 505/845; Y10S 505/846

See application file for complete search history.

(56) References Cited

U.S. PATENT DOCUMENTS

| 5,469,057 A | * | 11/1995 | Robinson | 324/248 |
| 2005/0088174 A1 | * | 4/2005 | Lee et al. | 324/248 |
| 2007/0114994 A1 | * | 5/2007 | Kobayashi et al. | 324/248 |

FOREIGN PATENT DOCUMENTS

| JP | H09329656 | | 12/1997 |
| JP | 2000292510 | | 10/2000 |
| JP | 2005345289 | A | 12/2005 |
| KR | 2003-0038111 | A | 5/2003 |

OTHER PUBLICATIONS

International Search Report for PCT/KR2010/003305 dated Dec. 31, 2010.

* cited by examiner

*Primary Examiner* — Jay Patidar
*Assistant Examiner* — David M. Schindler
(74) *Attorney, Agent, or Firm* — Jenkins, Wilson, Taylor & Hunt, P.A.

(57) ABSTRACT

Provided are a flux-locked loop circuit, a flux-locked loop method and a superconducting quantum interference device (SQUID) measuring apparatus. The flux-locked loop circuit includes a pre-amplifier configured to amplify a signal output of a SQUID, an integrator configured to integrate a signal output from the pre-amplifier and output the integrated signal, an operating range expanding unit configured to initialize the integrator by comparing an output signal of the integrator with a positive or negative reference reset voltage corresponding to an external flux of a predetermined integral multiple of flux quantum, and a feedback circuit configured to supply current to eliminate a difference between the external flux applied to the SQUID and a magnetic flux corresponding to an integral multiple of the reference reset voltage according to the output signal of the integrator.

6 Claims, 9 Drawing Sheets

Prior Art

FLUX-LOCKED LOOP CIRCUIT, FLUX-LOCKED LOOP METHOD, AND SQUID MEASURING APPARATUS

CROSS-REFERENCE TO RELATED APPLICATIONS

This application is a continuation of and claims priority to PCT/KR2010/003305 filed May 26, 2010, which claims priority to Korea Patent Application No. 10-2009-0114902 filed on Nov. 26, 2009, the entireties of which are both hereby incorporated by reference.

BACKGROUND OF THE INVENTION

1. Field of the Invention

The present invention relates to superconducting quantum interference devices (SQUIDs) and, more particularly, to a flux-locked loop circuit with an expanded operating range of a SQUID.

2. Description of the Related Art

A superconducting quantum interference device (hereinafter referred to as "SQUID") is a device for detecting minute magnetic fields. The SQUID is manufactured using a superconducting material to operate in an extremely low temperature helium or liquid nitrogen Dewar and converts a magnetic field into a voltage. In order to enhance measurement sensitivity and reduce peripheral environment noise, the SQUID is combined with various pick-up coils to be used as a precise magnetic sensor.

SUMMARY OF THE INVENTION

Embodiments of the present invention provide a flux-locked loop circuit in which an operating range is expanded without an additional current source.

Embodiments of the present invention also provide a flux pining method in which an operating range is expanded without an additional current source.

Embodiments of the present invention also provide a SQUID measuring apparatus in which an operating range is expanded without an additional current source.

In an aspect of the present invention, the flux-locked loop circuit may include a pre-amplifier configured to amplify a signal output of a SQUID, an integrator configured to integrate a signal output from the pre-amplifier and output the integrated signal, an operating range expanding unit configured to initialize the integrator by comparing an output signal of the integrator with a positive or negative reference reset voltage corresponding to an external flux of a predetermined integral multiple of flux quantum, and a feedback circuit configured to supply current to eliminate a difference between the external flux applied to the SQUID and the magnetic flux corresponding to an integral multiple of the reference reset voltage according to the output signal of the integrator.

In another aspect of the present invention, the flux-locked loop method may include integrating an output signal of a SQUID to provide an integrated signal, initializing the integrated signal by comparing the integrated signal with a positive or negative reference reset voltage corresponding to an external flux of a predetermined integral multiple of flux quantum, and supplying feedback current to eliminate a difference between the external flux applied to the SQUID and a magnetic flux corresponding to an integral multiple of the reference reset voltage according to the output signal of the integrator.

In further another aspect of the present invention, the SQUID measuring apparatus may include a pick-up coil configured to detect a magnetic field, a SQUID magnetically connected to the pick-up coil, and a detection circuit configured to process an output signal of the SQUID. The detection circuit may compare a signal output of an integrator by integrating the output signal of the SQUID with a positive or negative reference reset voltage corresponding to an external flux of a predetermined integral multiple of flux quantum to initialize the integrator.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION OF EMBODIMENTS

Figure 1:
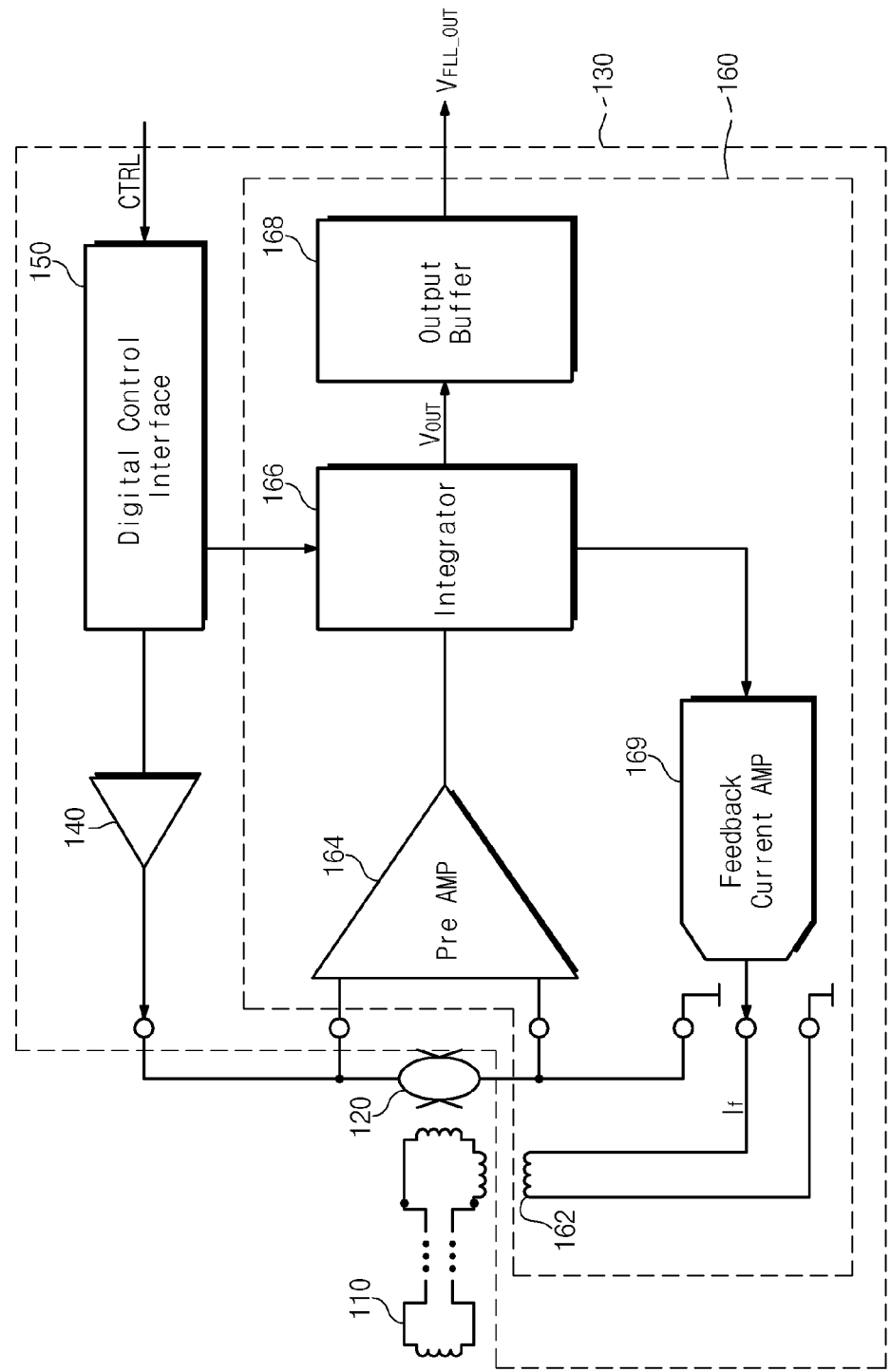
FIG. 1 illustrates a conventional SQUID measuring system.

FIG. 1 illustrates a conventional SQUID measuring system.

Figure 2:
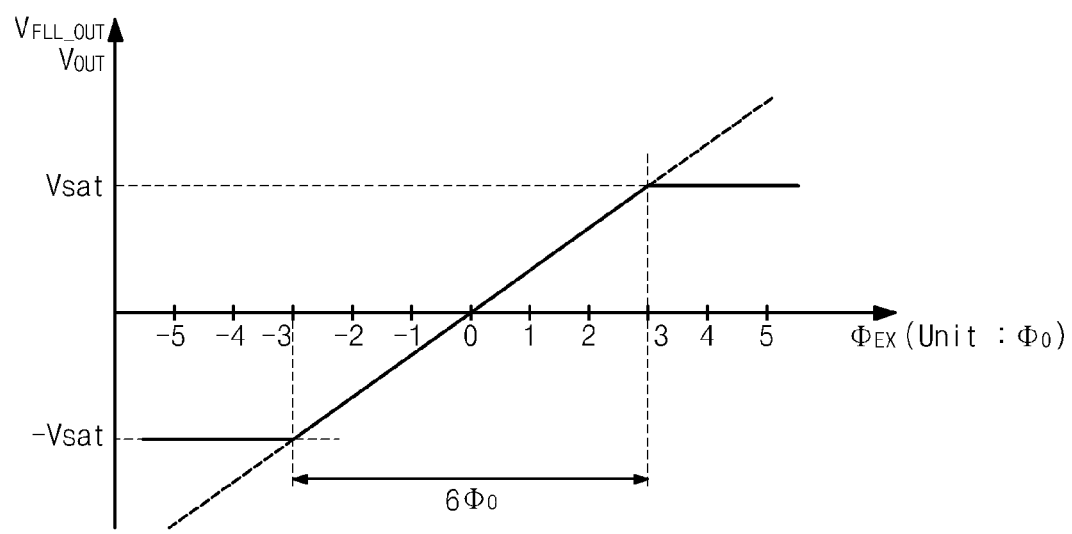
FIG. 2 illustrates a signal of the SQUID measuring system in FIG. 1.

FIG. 2 illustrates a signal of the SQUID measuring system in FIG. 1.

Referring to FIGS. 1 and 2, the SQUID measuring system includes a pick-up coil 110, a SQUID 120, and a detection circuit 130. The pick-up coil 110 applies a magnetic field to the SQUID 120 in response to an external magnetic flux $\Phi_{EX}$, and the SQUID 120 outputs a fine output voltage.

The detection circuit 130 includes a flux-locked loop (hereinafter referred to as "FLL") circuit 160, a current supply 140, and a digital control interface 150. The detection circuit 130 is composed of electrical components such as an operational amplifier (OP AMP), a transistor (TR), and the like. The detection circuit 130 has ±15 V or less as a constant voltage source, and an operating range of the detection circuit has a smaller value than ±15 V. The current supply 140 sends current operating the SQUID 120, and the digital control interface 150 receives an external digital signal CTRL to optimize the SQUID measuring system.

The FLL circuit 160 includes a pre-amplifier (Pre AMP) 164, an integrator 166, a feedback circuit 169, and a feedback coil 162. The pre-amplifier 164 amplifies an output voltage of the SQUID 120 to provide a stable signal. An output of the SQUID 120 obtained from the pre-amplifier 164 repeatedly appears in regular cycles due to change in external flux $\Phi_{EX}$ (unit: flux quantum, $\Phi_0$=2.07×10$^{-15}$ Wb).

The FLL circuit 160 is configured such that the output of the SQUID 120 has a value proportional to the external flux $\Phi_{EX}$. The FLL circuit 160 generates a magnetic flux having an opposite direction to the external flux $\Phi_{EX}$ at the feedback coil 162 to offset the external flux $\Phi_{EX}$ applied to the SQUID 120. Accordingly, The SQUID has only an initial magnetic flux. Feedback current If offsetting the external flux $\Phi_{EX}$ or an output voltage $V_{OUT}$ of the integrator 166 has a value proportional to the external flux $\Phi_{EX}$. A buffer 168 may receive the output voltage $V_{OUT}$ of the integrator 166 to provide a stable output $V_{FLL\_OUT}$.

A stably operating voltage range in the detection circuit 130 is determined by a maximum operating voltage of each electronic component and the magnitude of a constant voltage source. A flux range where the SQUID 120 normally operates and a range where the detection circuit 130 is normally operable are combined to determine the magnitude or dynamic range of the external flux $\Phi_{EX}$ that may be measured by the SQUID measuring system.

Referring to FIG. 2, when the external flux $\Phi_{EX}$ increases to reach 3$\Phi_0$, the output voltage $V_{FLL\_OUT}$ of the FLL circuit 160 has the maximum of +$V_{sat}$. When the external flux $\Phi_{EX}$ exceeds 3$\Phi_0$, the output voltage $V_{FLL\_OUT}$ of the FLL circuit 160 is saturated not to response to the external flux $\Phi_{EX}$. When the external flux $\Phi_{EX}$ is −3$\Phi_0$, the output voltage $V_{FLL\_OUT}$ of the FLL circuit 160 has the minimum of −$V_{sat}$. When the external flux $\Phi_{EX}$ is less than −3$\Phi_0$, the output voltage $V_{FLL\_OUT}$ of the FLL circuit 160 is saturated. Thus, an operating range of the FLL circuit 160 has 6$\Phi_0$. When the external flux $\Phi_{EX}$ is more than 6$\Phi_0$, the FLL circuit 160 fails to measure the external flux $\Phi_{EX}$ and has a saturated output only.

In the FLL circuit 160, if a voltage value responding to a flux is lowered, an operating range increases while a measurement resolution decreases. In the FLL circuit 160, if a flux/voltage response rate rises to 10$\Phi_0$/$V_{sat}$, the output voltage $V_{FLL\_OUT}$ of the FLL circuit 160 is not saturated and may be measured even when the external flux $\Phi_{EX}$ reaches 10$\Phi_0$. Meanwhile, a magnetic flux resolution that the output voltage can represent decreases.

Figure 3:
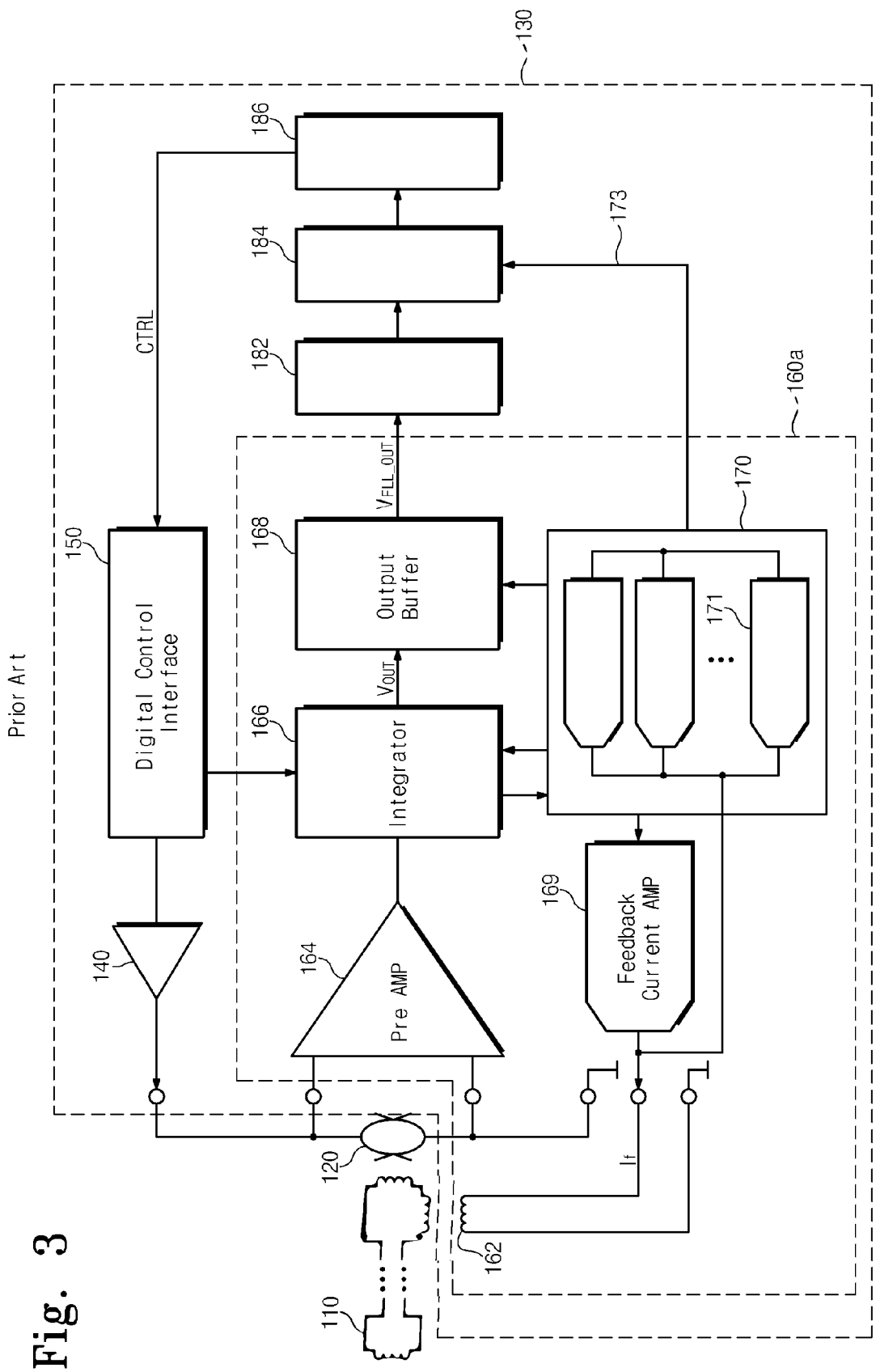
FIG. 3 illustrates another conventional SQUID measuring system.

FIG. 3 illustrates another conventional SQUID measuring system.

Figure 4:
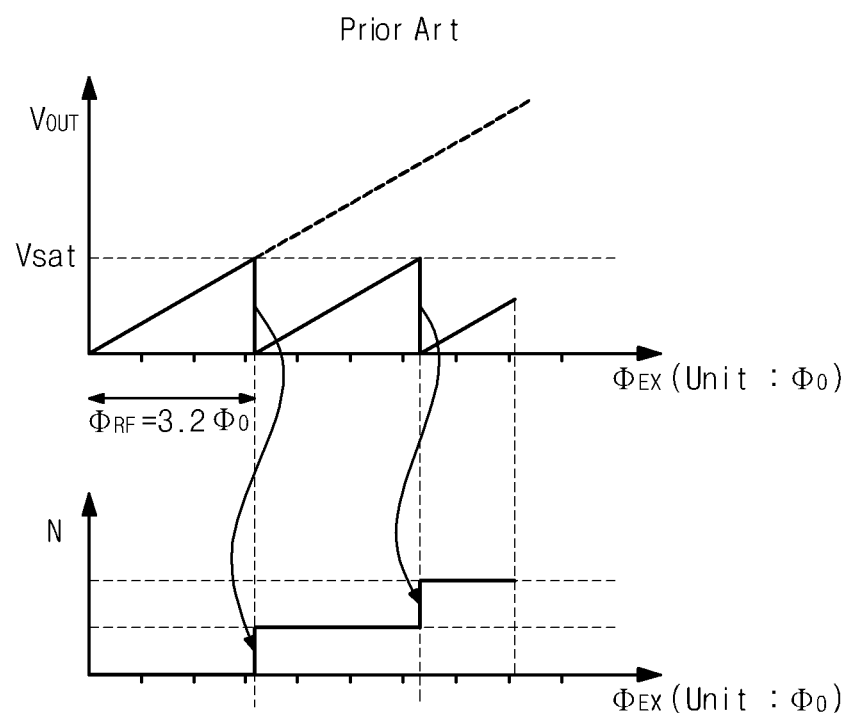
FIG. 4 illustrates a signal of the SQUID measuring system in FIG. 3.

FIG. 4 illustrates a signal of the SQUID measuring system in FIG. 3.

Referring to FIGS. 3 and 4, the SQUID measuring system includes a SQUID 120, a pick-up coil 110, and a detection circuit 130a. The detection circuit 130a may include an FLL circuit 160a, a current supply 140, a digital control interface 150, a sampling unit 182, a digital combiner 184, and a controller 186. Duplicate explanations as those described above in FIG. 1 will be omitted.

The FLL circuit 160a includes a pre-amplifier 164, an integrator 166, a feedback circuit 169, a feedback coil 162, and an operating range expanding circuit 170. The operating range expanding circuit 170 is disposed between the integrator 166 and the feedback circuit 169.

The operating range expanding circuit 170 includes a voltage comparator (not shown), a reset counter (not shown), and an additional current source 171. When an output voltage $V_{OUT}$ of the integrator 166 reaches +$V_{sat}$ with the increase of an external flux $\Phi_{EX}$, the integrator 166 is reset. That is, an output voltage $V_{OUT}$ of the integrator 166 is made to be 0 V and the reset counter increases the counting number N by one.

When the output voltage $V_{OUT}$ of the integrator 166 reaches −$V_{sat}$, the integrator 166 is reset. That is, the output voltage $V_{OUT}$ of the integrator 166 is made to be 0 V and the reset counter decreases the counting number N by one.

In proportion to the counting number N of the reset counter, the additional current source 171 supplies current to the feedback coil 162. The feedback circuit 169 supplies current, which is in proportion to the output voltage $V_{OUT}$ of the integrator 166, to the feedback coil 162. Accordingly, the total magnetic flux of the SQUID 120 always has 0 or a constant value.

Referring to FIG. 4, the output voltage $V_{OUT}$ of the integrator 166 and the counting number N of the reset counter are represented according to the external flux $\Phi_{EX}$. When a voltage/flux of the integrator 166 is +$V_{sat}$/$\Phi_{RF}$ and in the case where the external flux $\Phi_{EX}$ is $\Phi_{RF}$, the output voltage $V_{OUT}$ of the integrator 166 is reset at +$V_{sat}$ to be 0 V and the counting number N of the reset counter increases by +1. At the same time, one additional current source 171 is applied to the feedback coil 162. Current of the additional current source 171 offsets the external flux $\Phi_{EX}$ at the feedback coil 162.

When the output voltage $V_{OUT}$ of the integrator 166 increases from 0 V to reach +$V_{sat}$ again, i.e., the external flux $\Phi_{EX}$ becomes 2$\Phi_{RF}$, the integrator 166 is reset to be 0 V. In addition, the counting number N of the reset counter is made +2 by addition of +1. At the same time, one additional current source 171 is further added and thus two additional current sources 171 are connected to the feedback coil 162 to offset the external flux $\Phi_{EX}$ corresponding to the total 2$\Phi_{rf}$.

The total output voltage of the integrator 166 may be represented by combining the output voltage $V_{OUT}$ of the integrator 166 with the counting number N. When the counting number is N and an output voltage of the integrator 166 is $V_{OUT}$, the total output $V_{TOT}$ is expressed as follows: $V_{TOT}$=N$V_{sat}$+$V_{OUT}$. For example, when N=3, $V_{sat}$=10 V, $\Phi_{RF}$=3.2$\Phi_0$, and $V_{OUT}$=1.25 V and if an external flux $\Phi_{EX}$ is 10$\Phi_0$, the total output $V_{TOT}$ is expressed as follows: $V_{TOR}$=31.25 V and a magnetic flux $\Phi_{TOR}$ is obtained by the following equation: $\Phi_{TOR}$=$V_{OUT}$($\Phi_{RF}$/$V_{sat}$)=31.25* 0.32$\Phi_0$=10$\Phi_0$.

In order to expand the operating range of the SQUID measuring system, the operating range expanding circuit 170 requires a voltage comparator, a reset counter, and additional current sources 171. In order to combine the output voltage $V_{OUT}$ of the integrator 166 with the counting number N, the sampling unit 182 is required to convert the output signal $V_{OUT}$ of the integrator 166 into a digital signal. The digital combiner 184 combines the counting number N with the digital signal to provide a final output. The SQUID measuring system uses a plurality of interconnections and thus is vulnerable to noise.

A reset of the integrator 166 is necessarily done within an appropriate time, and the FLL circuit 160a is maintained at an initial FLL state.

When the reset time of the integrator 166 is too fast, a voltage of a capacitor constituting the integrator 166 is not fully discharged. Accordingly, the integrator 166 is not reset to 0 V.

When the reset time of the integrator 166 is too long, the FLL circuit 166a deviates from the FLL state.

For this reason, when an output of the voltage comparator is provided to the integrator 166 as a reset signal and a high-speed external flux is measured, the reset of the integrator 166 may be unstable.

The reset counter includes an UP/DOWN counter circuit to record reset count of the integrator 166. In this case, an output of the reset counter is connected to a switch of the additional current source 171 and combined with the output of the integrator 166. The output voltage $V_{OUT}$ of the integrator 166 is converted into a digital signal, and the digital combiner 184 combines the digital signal with the output of the reset counter. As a result, the operating range expanding circuit 170 increases power consumption and digital noise. That is, an additional digital line 173 is required and digital noise increases due to the additional digital line 173.

A number of additional current sources 171 and a switch are required to supply additional current to the feedback coil 162 according to the output of the reset counter. The additional current must flow to the feedback coil 162 at high speed. If the additional current is not synchronized with the reset time of the integrator 166, sufficient current does not flow to the feedback coil 162. Accordingly, the feedback coil 162 does not offset a magnetic flux at the SQUID 120. In this case, the FLL circuit 160a is not maintained at the FLL state and deviates therefrom. Thus, the integrator 166 outputs a saturated or incorrect value.

As a result, the operating range of the SQUID 120 is limited according to the reset time of the integrator 166 and operating times of the reset counter and the additional current source. In addition, the maximum number of additional current sources 171 determines the maximum operating range. If the number of the additional current sources 171 increases, the maximum operating range is expanded but a circuit configuration becomes complex and power consumption increases.

Exemplary embodiments of the present invention will now be described more fully hereinafter with reference to the accompanying drawings. The embodiments may, however, be embodied in many different forms and should not be construed as being limited to the instances set forth herein. Rather, the embodiments herein are merely provided to help convey various concepts to those of ordinary skill in the art. In the drawings, the size of each element may have been exaggerated for clarity. Like reference numerals denote like elements throughout.

Figure 5:
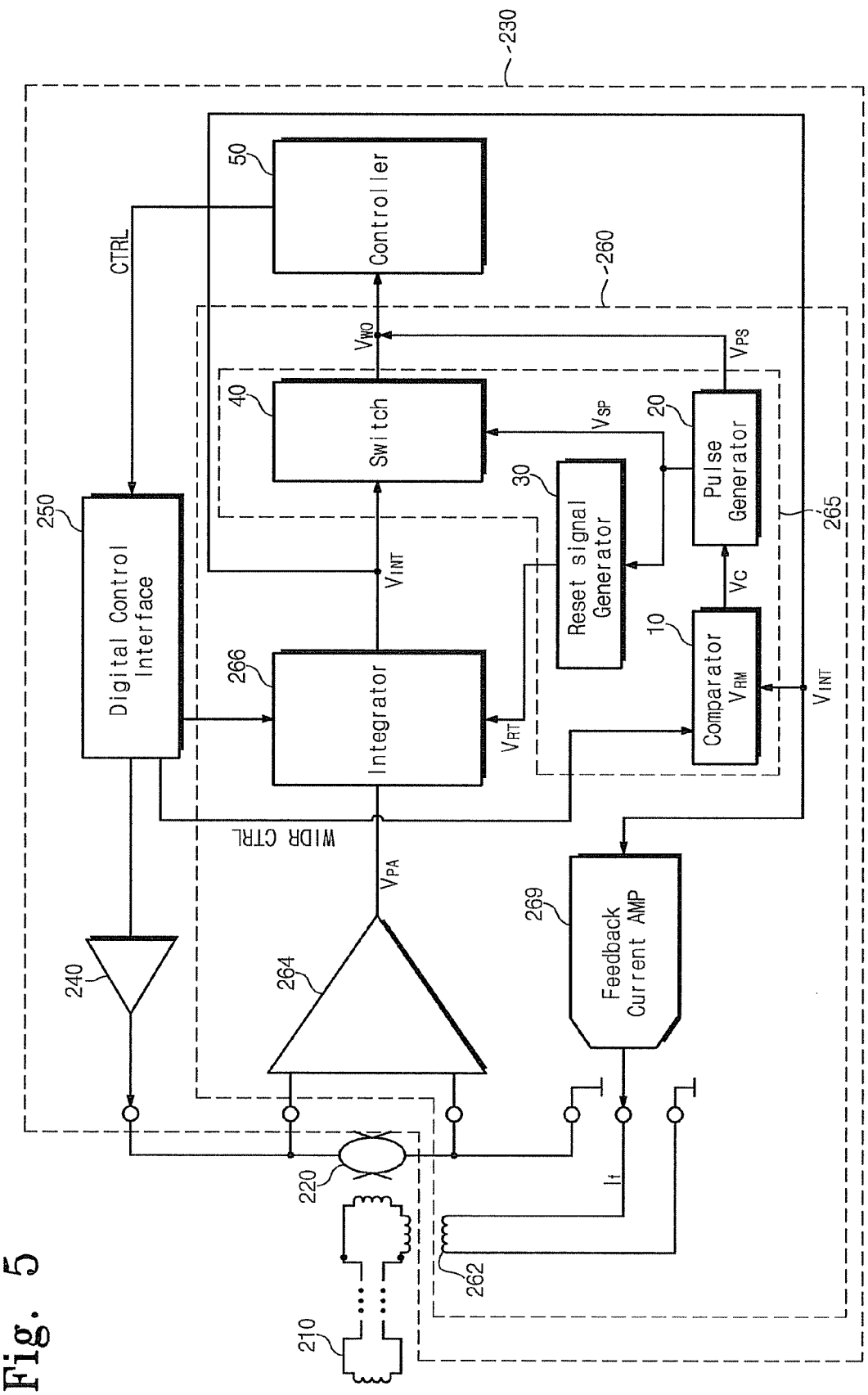
FIG. 5 illustrates a SQUID measuring system according to one embodiment of the present invention.

FIG. 5 illustrates a SQUID measuring system according to one embodiment of the present invention.

Figure 6:
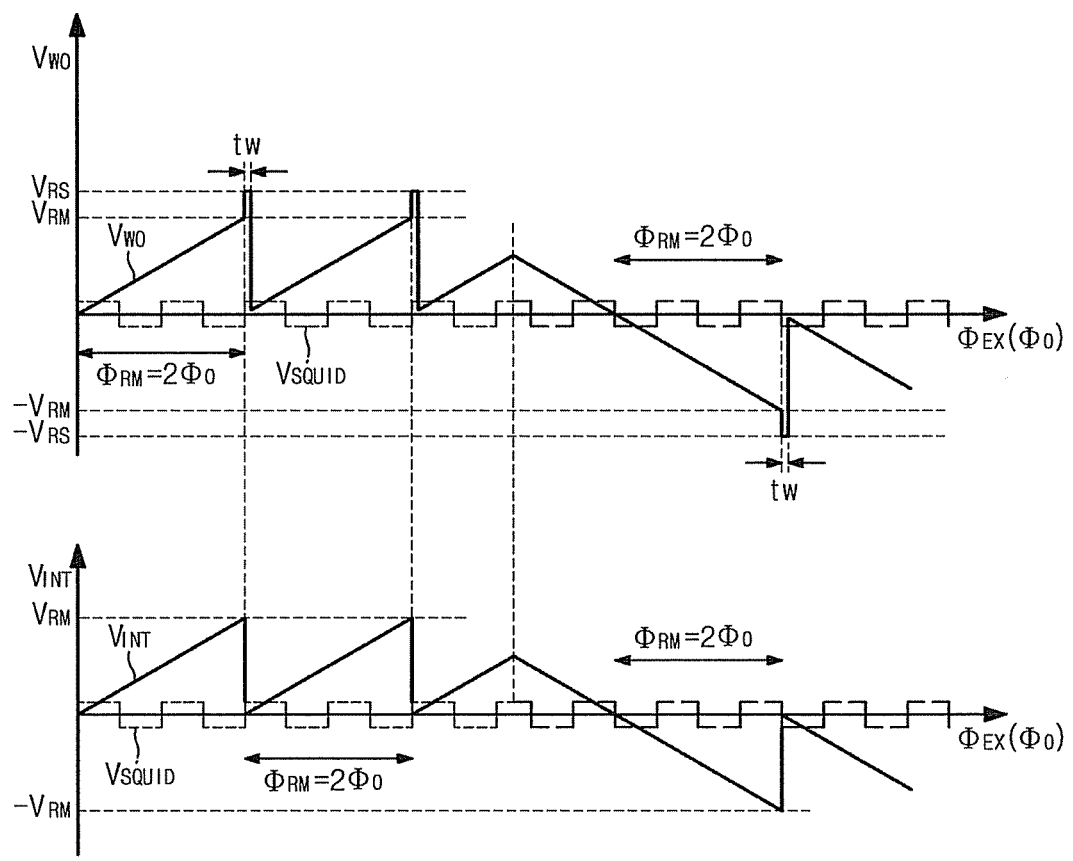
FIG. 6 illustrates the operating principle of the SQUID measuring system according to one embodiment of the present invention.

FIG. 6 illustrates the operating principle of the SQUID measuring system according to one embodiment of the present invention.

Referring to FIGS. 5 and 6, the SQUID measuring system may include a SQUID 220, a pick-up coil 210, and a detection circuit 230. The detection circuit 230 may include an FLL circuit 260, a current supply 240, a digital control interface 250, and a controller 50. The pick-up coil 210, the SQUID 220, and a feedback coil 262 may be disposed inside a liquid refrigerant.

The FLL circuit 260 may include a pre-amplifier 264 configured to amplify a signal output from the SQUID 220, an integrator 266 configured to integrate and output an output signal $V_{PA}$ of the pre-amplifier 264, an operating range expanding unit 265 configured to initialize the integrator 266 by comparing an output signal $V_{OUT}$ of the integrator 266 with a positive or negative reference reset voltage $V_{RM}$ corresponding to an external flux $\Phi_{EX}$ of a predetermined integral multiple of flux quantum $\Phi_0$, and a feedback circuit 269 configured to supply current to eliminate a difference between the external flux $\Phi_{EX}$ applied to the SQUID 220 and a magnetic flux corresponding to an integral multiple of the reference reset voltage $V_{RM}$ according to the output signal $V_{INT}$ of the integrator 266.

The pre-amplifier 264 may be an operational amplifier (OP AMP). The integrator 266 may be implemented by an integration circuit. The controller 50 may include a sampling unit.

The controller 50 may sample and operate an output signal $V_{WO}$ of the FLL circuit 260 and control the digital control interface 250.

Continuing to refer to FIGS. 5 and 6, a voltage-flux characteristic of the SQUID 220 may be represented by a square-wave signal. That is, an output voltage of the SQUID 220 responding to the external flux $\Phi_{EX}$ (voltage-flux characteristic) may repeatedly appear in the flux quantum $\Phi_0$.

When the FLL circuit 260 operates typically, feedback current If and an output voltage of the integrator 266 may be proportional to increase in the external flux $\Phi_{EX}$. However, a constant voltage source supplied to the FLL circuit 260 and operating characteristics of electronic elements constituting a circuit may limit the output voltage of the integrator 266. Accordingly, the output of the integrator 266 may be limited under a saturated voltage of the circuit.

In order to overcome the above limitation and expand an operating range, a reset point of the integrator 266 may be set to an integral multiple point of the flux quantum $\Phi_0$ from an initial point to which the external flux $\Phi_{EX}$ is not applied. In this case, the integrator 266 may operate under the same SQUID characteristics and may not have an offset voltage.

When the feedback current If of the feedback circuit 269 increases with the increase in the external flux $\Phi_{EX}$, the output voltage $V_{INT}$ of the integrator 266 increases to a positive reference reset voltage $+V_{RM}$. The positive reference reset voltage $+V_{RM}$ is within the range where a circuit stably operates with a pre-saturated voltage in the FLL circuit 265. The positive reference reset voltage $+V_{RM}$ may correspond to an interval flux $\Phi_{RM}$. When the integrator 266 is reset in the positive reference reset voltage $+V_{RM}$, the output voltage $V_{OUT}$ of the integrator 266 indicates a voltage of 0 V or a constant start voltage. The interval flux $\Phi_{RM}$ is an integral multiple of flux quantum. The interval flux $\Phi_{RM}$ may be an interval of the external flux $\Phi_{EX}$.

For example, the interval flux $\Phi_{RM}$ may be $2\Phi_0$. The output voltage $V_{INT}$ of the reset integrator 266 may be provided to the feedback circuit 269, and the feedback circuit 269 may remove the feedback current If that is flowing to the feedback coil 262. When the external flux $\Phi_{EX}$ is an integral multiple of the interval flux $\Phi_{RM}$, the feedback current If and the output voltage $V_{INT}$ of the integrator 266 may be restarted at zero (0) or a constant value. If the interval flux $\Phi_{RM}$ is defined as an integral multiple $n\Phi_0$ (n being an integer) of flux quantum, the FLL circuit 260 may repeatedly output the same SQUID characteristics according to the reset of the integrator 266.

Figure 7:
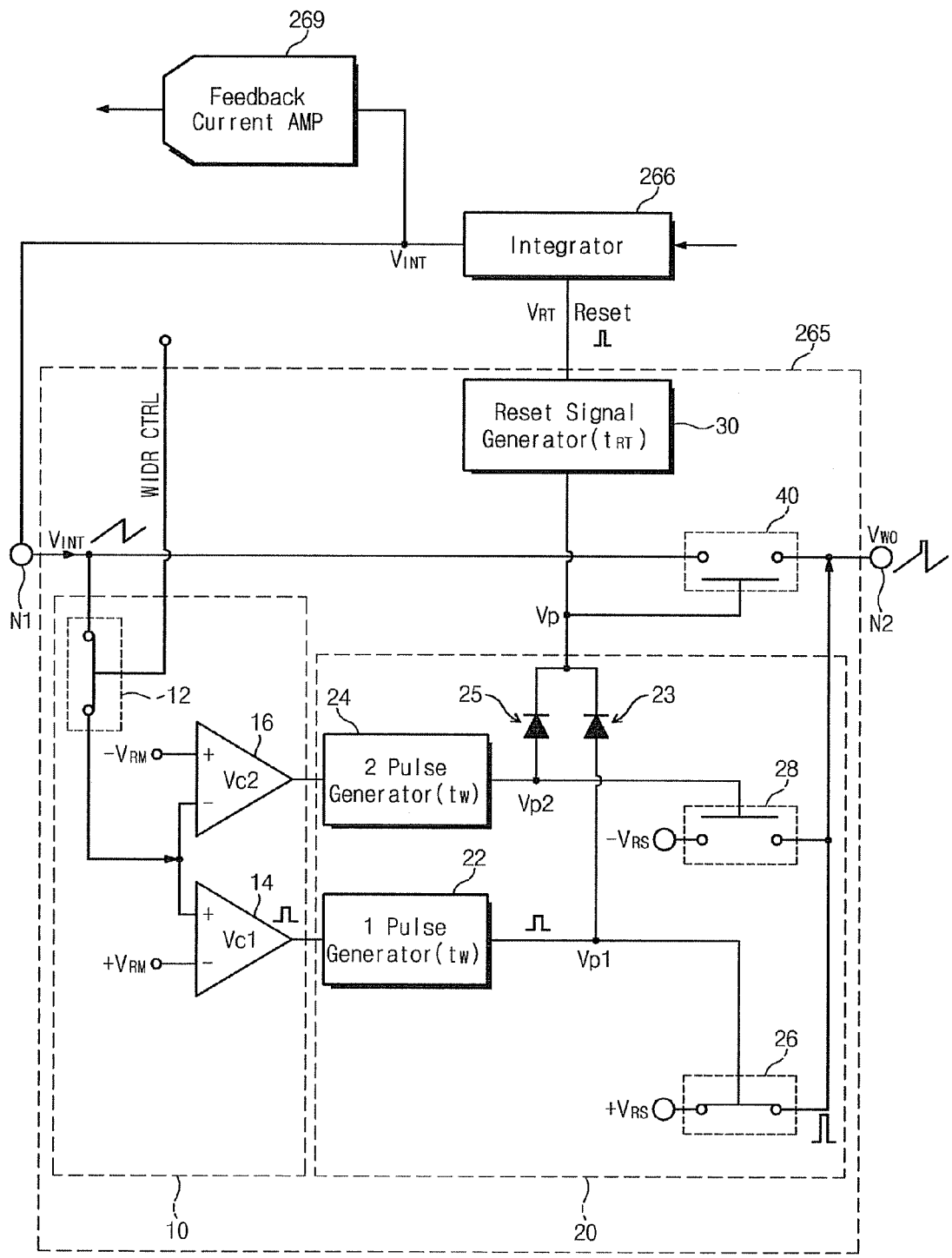
FIG. 7 illustrates an operating range expanding unit of the SQUID measuring system according to one embodiment of the present invention.

FIG. 7 illustrates an operating range expanding unit of the SQUID measuring system according to one embodiment of the present invention.

Figure 8:
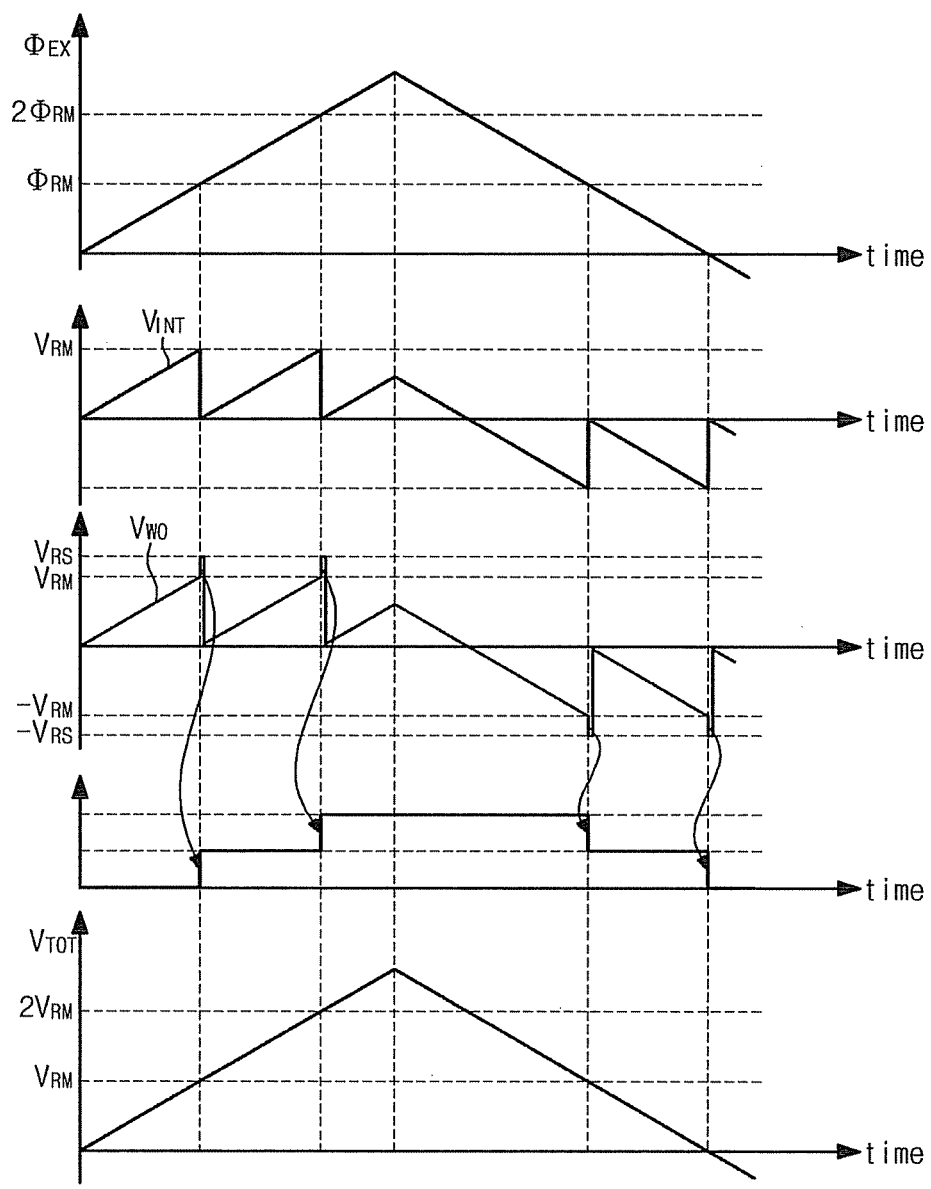
FIG. 8 is a timing diagram of the SQUID measuring system according to one embodiment of the present invention.

FIG. 8 is a timing diagram of the SQUID measuring system according to one embodiment of the present invention.

Referring to FIGS. 7 and 8, an operating range expanding unit 265 may include a comparator 10, a pulse generator 20, a reset signal generator 30, and a switch 40.

The comparator 10 may output comparison signals $V_{C1}$ and $V_{C2}$ by comparing an output signal $V_{INT}$ of the integrator 266 with a positive or negative reference reset voltage $V_{RM}$ corresponding to an external flux of a predetermined integral multiple of flux quantum.

The comparator 10 may be configured with a window comparator. When the output voltage $V_{INT}$ of the integrator 266 is higher than a positive reference reset voltage $+V_{RM}$ or lower than a negative reference reset voltage $-V_{RM}$, the comparator 10 may output the comparison signals. Vc1 and Vc2. The comparison signals Vc1 and Vc2 may be a digital ON voltage $+V_0$. When the output voltage $V_{INT}$ of the integrator 266 is greater than $-V_{RM}$ and smaller than $+V_{RM}$, the comparator 10 normally executes FLL and the pulse generator 20 does not operate. Thus, the output voltage $V_{INT}$ of the integrator 266 is directly provided to a controller 50 through the switch 40. The controller 50 may include a sampling unit. The controller 50 may convert the output voltage $V_{INT}$ of the integrator 266 into a digital signal to carry out an operation.

The comparator 10 may include a first comparator 14 and a second comparator 16. The first comparator 14 may output a first comparison signal Vc1 by comparing the positive reset voltage $+V_{RM}$ with the output voltage $V_{INT}$ of the integrator 266. The second comparator 16 may output a second comparison signal Vc2 by comparing the negative reset voltage $-V_{RM}$ with the output voltage $V_{INT}$ of the integrator 266.

The comparator 10 may include the comparison switch 12. The comparison switch 12 may receive a control signal WIDR CTRL from a digital control interface 250 and provide the output voltage $V_{INT}$ of the integrator 266 to the comparator 10.

The pulse generator 20 may receive the comparison signals Vc1 and Vc2 of the comparator 10 to provide a pulse signal Vp having a predetermined pulse width. The pulse generator 20 may generate a sampling pulse signal Vps using the pulse signal Vp and provide the sampling pulse signal Vps to an output terminal of the switch 40. The generation of the sampling pulse signal Vps may be done by adding a predetermined voltage to the reference reset voltage $V_{RM}$. An absolute value of the sampling pulse signal Vps must be greater than that of the reference reset voltage $V_{RM}$. The absolute value of the sampling pulse signal Vps is smaller than that of a samplable maximum voltage of the sampling unit.

The pulse generator 20 may include a first pulse generator 22, a second pulse generator 24, a first pulse switch 26, a first diode 23, a second pulse switch 28, and a second diode 25.

The first pulse generator 22 may provide a first pulse signal Vp1 having a first pulse width $t_{W1}$ using the first comparison signal Vc1 of the first comparator 14. The second pulse generator 24 may provide a second pulse signal Vp2 having a second pulse width $t_{W2}$ using the second comparison signal Vc2 of the second comparator 16. The first pulse signal Vp1 and the second pulse signal Vp2 may be one shot pulse having a size of $+V_0$.

The first pulse switch 26 and the first diode 23 may be connected in parallel to an output terminal of the first pulse generator 22. The second pulse switch 28 and the second diode 25 may be connected in parallel to an output terminal of the second pulse generator 24. Output terminals of the first and second diodes 23 and 25 may be connected to each other to be provided as a control signal of the reset signal generator 30 and the switch 40. The first and second diodes 23 and 25 may provide pulse directionality. When the pulse signal Vp is in a high state, the switch 40 may electrically isolate an output terminal N1 of the integrator 266 and an output terminal N2 of an FLL circuit 260 from each other. Output terminals of the first and second pulse switches 26 and 28 may be connected to the output terminal N2 of the switch 40.

The first pulse switch 26 may provide a positive sampling pulse signal $V_{PS}$ having a positive sampling voltage $+V_{RS}$ to the output terminal N2 of the switch 40 during the operation of the first pulse signal Vp1. The second pulse switch 28 may provide a negative sampling pulse signal $V_{PS}$ having a negative sampling voltage $-V_{RS}$ to the output terminal N2 of the switch 40 during the operation of the second pulse signal Vp2. The positive sampling pulse signal $V_{PS}$ may have the first pulse width $t_{w1}$, and the negative sampling pulse signal $V_{PS}$ may have the second pulse width $t_{w2}$. The first pulse width $t_{w1}$ and the second pulse width $t_{w2}$ may be greater than a sampling period T of the controller 50. Thus, the controller 50 may recognize the sampling pulse signal. In this case, the FLL circuit 260 may provide an output voltage and the reset number of the integrator 266 to the controller 50 using one interconnection without use of a plurality of interconnections. As a result, the FLL circuit may be resistant against noise.

The reset signal generator 30 may generate a reset signal $V_{RT}$ to initialize the integrator 266 using the pulse signal Vp of the pulse generator 20. A pulse width $t_{RT}$ of the reset signal $V_{RT}$ may be smaller than a pulse width tw of a signal output from the pulse generator 20. Due to the pulse width $t_{RT}$ of the reset signal $V_{RT}$, the output voltage $V_{NT}$ of the integrator 266 may be fully discharged to be made 0 V.

The switch 40 is connected to the output terminal N1 of the integrator 266 and may receive the pulse signal Vp of the pulse generator 20. The switch 40 may output the output voltage $V_{NT}$ of the integrator 266 while the output voltage $V_{NT}$ of the integrator 266 operates above the negative reference reset voltage $-V_{RM}$ or below the positive reference reset voltage $+V_{RM}$. When the pulse signal Vp is in a high state, the switch 40 may provide the sampling pulse signal $V_{PS}$ to the controller 50 through the output terminal N2 of the switch 40.

An output signal $V_{WO}$ of the FLL circuit 260 input to the controller 50 may be classified into the output voltage $V_{NT}$ of the integrator 266 and the sampling pulse signal. $V_{PS}$. By carrying out an operation, the controller 50 may calculate and express a total output voltage $V_{TOT}$ that is proportional to an external flux $\Phi_{EX}$.

The controller 50 increases the reset counting number N by +1 when the output signal $V_{WO}$ of the FLL circuit 260 changes to $+V_{RS}$. In addition, the controller 50 decreases the reset counting number N by −1 when the output signal $V_{WO}$ of the FLL circuit 260 changes to $-V_{RS}$. Accordingly, the controller 50 may calculate the external flux $\Phi_{EX}$ using the reset counting number N and the output voltage $V_{NT}$ of the integrator 266. More specifically, the total output signal $V_{TOT}$ is expressed as follows: $V_{TOT}=N\,V_{RM}+V_{NT}$. If a voltage-flux conversion rate $\Phi_{RM}/V_{RM}$ is applied, the total external flux $\Phi_{TOT}$ is determined as follows: $\Phi_{TOT}=V_{TOT}(\Phi_{RM}/V_{RM})$. At this point, an interval magnetic flux $\Phi_{RM}$ is an integral multiple of flux quantum $\Phi_0$. Accordingly, the controller 50 may measure the total external flux $\Phi_{TOT}$ with no limit to the reset number.

Figure 9:
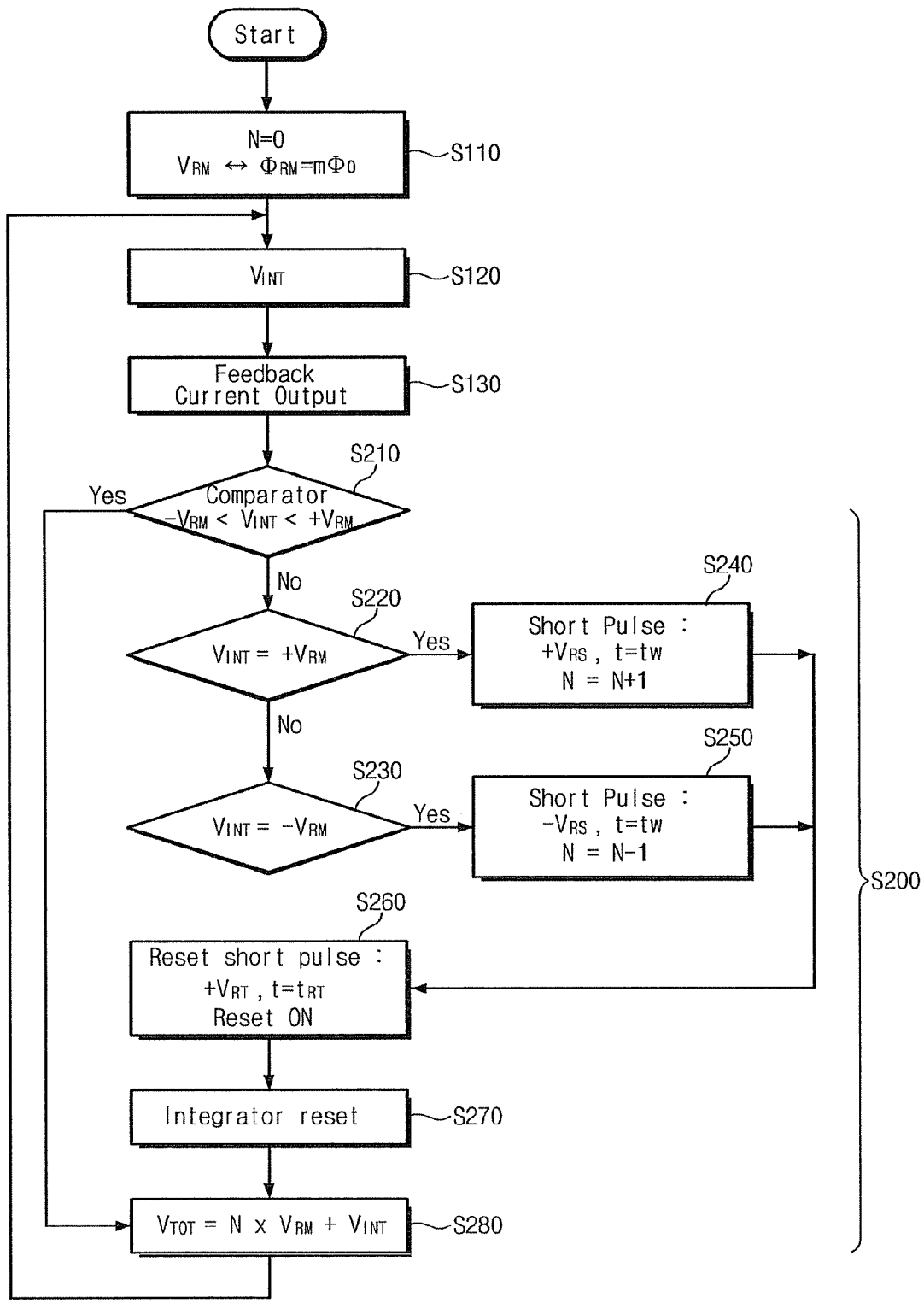
FIG. 9 illustrates a flowchart illustrating a flux-locked loop method according to one embodiment of the present invention.

FIG. 9 illustrates a flowchart illustrating a flux-locked loop method according to one embodiment of the present invention.

Referring to FIG. 9, the flux-locked loop method includes integrating an output signal of a SQUID to provide an integrated signal (S120), initializing the integrated signal by comparing the integrated signal with a positive or negative reference reset voltage corresponding to an external flux of a predetermined integral multiple of flux quantum (S200), and supplying feedback current to eliminate a difference between the external flux applied to the SQUID and a magnetic flux corresponding to an integral multiple of the reference reset voltage according to the output signal of the integrator (S130).

The reset number N of initializing the integrated signal may be set to 0. In addition, a relationship between an interval flux $\Phi_{RM}$ and a reference reset voltage $V_{RM}$ may be set. The interval flux $\Phi_{RM}$ may be an integral multiple of flux quantum.

The output signal of the SQUID may be integrated to provide an integrated signal $V_{INT}$ (S120). The feedback current may be supplied to partially or fully offset the external flux in response to the integrated signal $V_{INT}$ (S130).

Next, the integrated signal may be initialized (S200). The integrated signal and a positive or negative reference reset voltage may be compared with each other (S210). If the integrated signal $V_{INT}$ is equal to a positive reference reset voltage $+V_{RM}$, the reset number N may increase. In addition, if the integrated signal $V_{INT}$ is equal to the positive reference reset voltage $+V_{RM}$, a sampling pulse $V_{RS}$ may be generated which has a pulse width tw and has a greater magnitude than the reference reset voltage (S240).

If the integrated signal $V_{INT}$ is equal to a negative reference reset voltage $-V_{RM}$, the reset number N may decrease. In addition, if the integrated signal $V_{INT}$ is equal to a negative reference reset voltage $-V_{RM}$, a sampling pulse $V_{RS}$ may be generated which has a pulse width tw and has a greater magnitude than the reference reset voltage (S250).

When the sampling pulse signal is generated, a reset pulse signal $V_{RT}$ having another pulse width $T_{RT}$ may be generated (S260). The reset pulse signal may initialize the integrated signal (S270). The reset number N and the integrated signal $V_{INT}$ may provide a total integrated signal $V_{TOT}$.

A flux-locked loop (FLL) circuit according to an embodiment of the present invention may be applied to a superconducting quantum interference device nuclear magnetic resonance (SQUID NMR) system. The SQUID NMR system includes a SQUID sensor configured to detect spin and magnetic moment of atoms that are induced while relaxing after a magnetic field of tens of mT or less after is applied to an object in a low magnetic field NMR system. The SQUID NMR system makes low magnetic field magnetic resonance imaging (MRI) possible. The SQUID NMR system may be combined with an FLL circuit according to an embodiment of the present invention to measure a minute magnetic field under the environment where a magnetic field of tens of mT changes rapidly. More specifically, the SQUID NMR system may measure a minute magnetic field of brain to obtain not only an accurate brain MRI signal and but also magnetoencephalography (MEG).

A SQUID measuring apparatus may measure magnetocardiography (MCG) or magnetoencephalography (MEG) without use of a magnetically shielded room (MSR) or in a weak MSR. At this point, magnetic noise may be measured together with the MCG or MEG. The magnetic noise is generated under an external environment such as a power of 60 Hz, an automobile, and a building air conditioner that is hundreds or thousands of times greater than the MCG or MEG. Thus, the SQUID measuring system suffers from difficulty in measuring a signal while keeping optimal resolution.

Sensitivity of a SQUID measuring apparatus combined with an FLL circuit according to an embodiment of the present invention may be optimized to the amplitude of MCG and MEG signals, and external environmental magnetic noise may also be measured with the same sensitivity. In addition, the SQUID measuring apparatus operates without being saturated by an external flux or magnetic field.

The SQUID measuring apparatus combined with an FLL circuit according to an embodiment of the present invention may measure all the external fluxes within the flux range where a SQUID operates. In addition, a measured signal may be filtered or interpreted using software of a computer according to the purpose.

In a flux-locked loop (FLL) circuit according to an embodiment of the present invention, an integrator reset is executed at an FLL point spaced apart by an integral multiple of flux quantum from a start FLL point. Thus, the same FLL state is always maintained and additional feedback current is not required. An output signal of the FLL circuit is transmitted to a controller through one output terminal, and the controller allows software to measure an external flux using the output signal with not limit within an operating range of a SQUID.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A flux-locked loop circuit comprising:
a pre-amplifier configured to amplify a signal output of a superconducting quantum interference device (SQUID);
an integrator configured to integrate a signal output from the pre-amplifier and output the integrated signal;
an operating range expanding unit configured to initialize the integrator by comparing the integrated signal of the integrator with a positive or negative reference reset voltage corresponding to an external flux of a predetermined integer multiple of flux quantum; and
a feedback circuit configured to supply current to eliminate a difference between an external flux applied to the SQUID and a magnetic flux corresponding to an integer multiple of the positive or negative reference reset voltage according to the integrated signal of the integrator;
wherein the operating range expanding unit comprises:
a comparator configured to output a comparison signal by comparing the integrated signal of the integrator with the positive or negative reference reset voltage;
a pulse generator configured to receive the comparison signal and output a main pulse signal having a predetermined width;
a reset signal generator configured to generate a reset signal using the pulse signal of the pulse generator to reset the integrator, the reset signal generator configured to provide the reset signal to the integrator; and
a main switch connected to an output terminal of the integrator and configured to receive the pulse signal of the pulse generator and output the integrated signal of the integrator while the integrated signal of the integrator operates above the negative reference reset voltage or below the positive reference reset voltage,
wherein the pulse generator generates a sampling pulse signal using the main pulse signal by adding a predetermined voltage to the positive or negative reference reset voltage and provides the sampling pulse signal to an output terminal of the switch,
wherein the comparator comprises:
a first comparator configured to compare the positive reference reset voltage with the integrated signal of the integrator and output a first comparison signal; and
a second comparator configured to compare the negative reference reset voltage with the integrated signal of the integrator and output a second comparison signal.

2. The flux-locked loop circuit of claim 1, further comprising: a controller comprising a sampling unit,
wherein the controller converts the integrated signal into a digital signal.

3. The flux-locked loop circuit of claim 1, wherein the pulse generator comprises:
a first pulse generator configured to provide a first pulse signal having a first pulse width using the first comparison signal of the first comparator; and
a second pulse generator configured to provide a second pulse signal having a second pulse width using the second comparison signal of the second comparator.

4. The flux-locked loop circuit of claim 3, wherein the pulse generator further comprises:

a first pulse switch and a first diode connected to an output terminal of the first pulse generator; and a second pulse switch and a second diode connected to an output terminal of the second pulse generator, wherein output terminals of the first and second diodes are connected to each other to provide the main pulse signal to the reset signal generator, wherein output terminals of the first and second pulse switches are connected to the output terminal of the main switch, wherein the sampling pulse signal comprises a positive sampling pulse signal or a negative sampling pulse signal, wherein the first pulse switch provides the positive sampling pulse signal during operation of the first pulse signal, and wherein the second pulse switch provides the negative sampling pulse signal during operation of the second pulse signal.

5. The flux-locked loop circuit of claim 1, wherein a width of the reset signal corresponds to time required for fully discharging the integrated signal of the integrator.

6. The flux-locked loop circuit of claim 1, further comprising: a controller comprising a sampling unit, wherein the external flux applied to the SQUID is extracted using the sampling pulse signal and the integrated signal of the integrator, wherein the controller calculates the external flux using a reset count number and the integrated signal of the integrator, and wherein the controller changes the reset count number when a voltage of the output terminal of the switch is the positive or negative reference voltage.

* * * * *